United States Patent
Kim

(10) Patent No.: US 11,556,281 B2
(45) Date of Patent: Jan. 17, 2023

(54) SEMICONDUCTOR MEMORY DEVICE AND CONTROLLER

(71) Applicant: SK hynix Inc., Icheon-si (KR)

(72) Inventor: Byoung Young Kim, Yongin-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/898,027

(22) Filed: Jun. 10, 2020

(65) Prior Publication Data

US 2021/0191664 A1 Jun. 24, 2021

(30) Foreign Application Priority Data

Dec. 19, 2019 (KR) .......................... 10-2019-0171248

(51) Int. Cl.
*G06F 3/06* (2006.01)
*G11C 16/10* (2006.01)
*G11C 16/14* (2006.01)

(52) U.S. Cl.
CPC .......... *G06F 3/0679* (2013.01); *G06F 3/0604* (2013.01); *G06F 3/0655* (2013.01); *G11C 16/10* (2013.01); *G11C 16/14* (2013.01)

(58) Field of Classification Search
CPC .... G06F 3/0679; G06F 3/0604; G06F 3/0655; G11C 16/10
See application file for complete search history.

(56) References Cited

U.S. PATENT DOCUMENTS

2016/0313946 A1* 10/2016 Zang ...................... G06F 3/0611
2018/0151237 A1* 5/2018 Lee ......................... G11C 16/16

FOREIGN PATENT DOCUMENTS

KR 1020180050862 A 5/2018
KR 1020180060885 A 6/2018

* cited by examiner

*Primary Examiner* — Masud K Khan
*Assistant Examiner* — Dustin B. Fulford
(74) *Attorney, Agent, or Firm* — William Park & Associates Ltd.

(57) ABSTRACT

A semiconductor memory device includes a memory cell array, a peripheral circuit, and control logic. The memory cell array includes a plurality of memory cells. The peripheral circuit is configured to perform a first operation, corresponding to a first command, on the memory cell array. The control logic is configured to control the first operation of the peripheral circuit. The control logic is configured to control the peripheral circuit to suspend the performance of the first operation and perform a second operation corresponding to a second command, in response to the second command being received while the first operation is being performed.

17 Claims, 15 Drawing Sheets

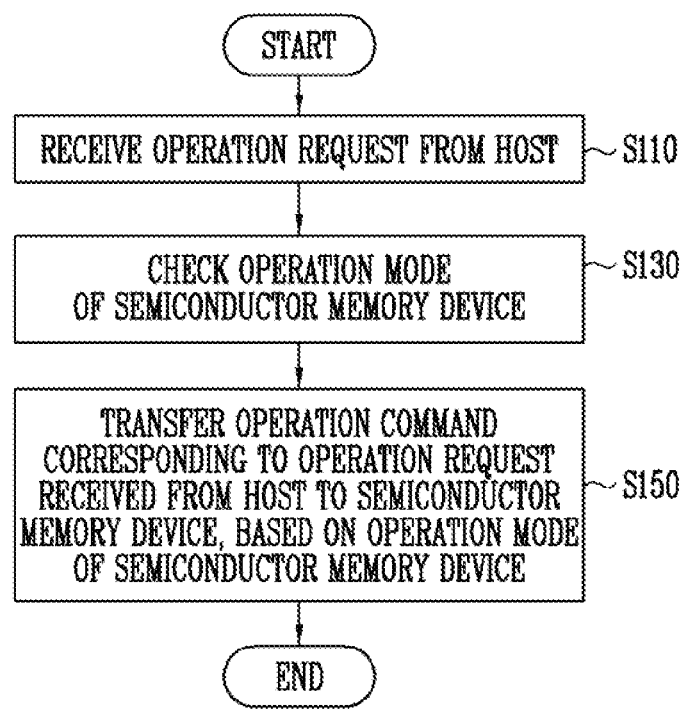

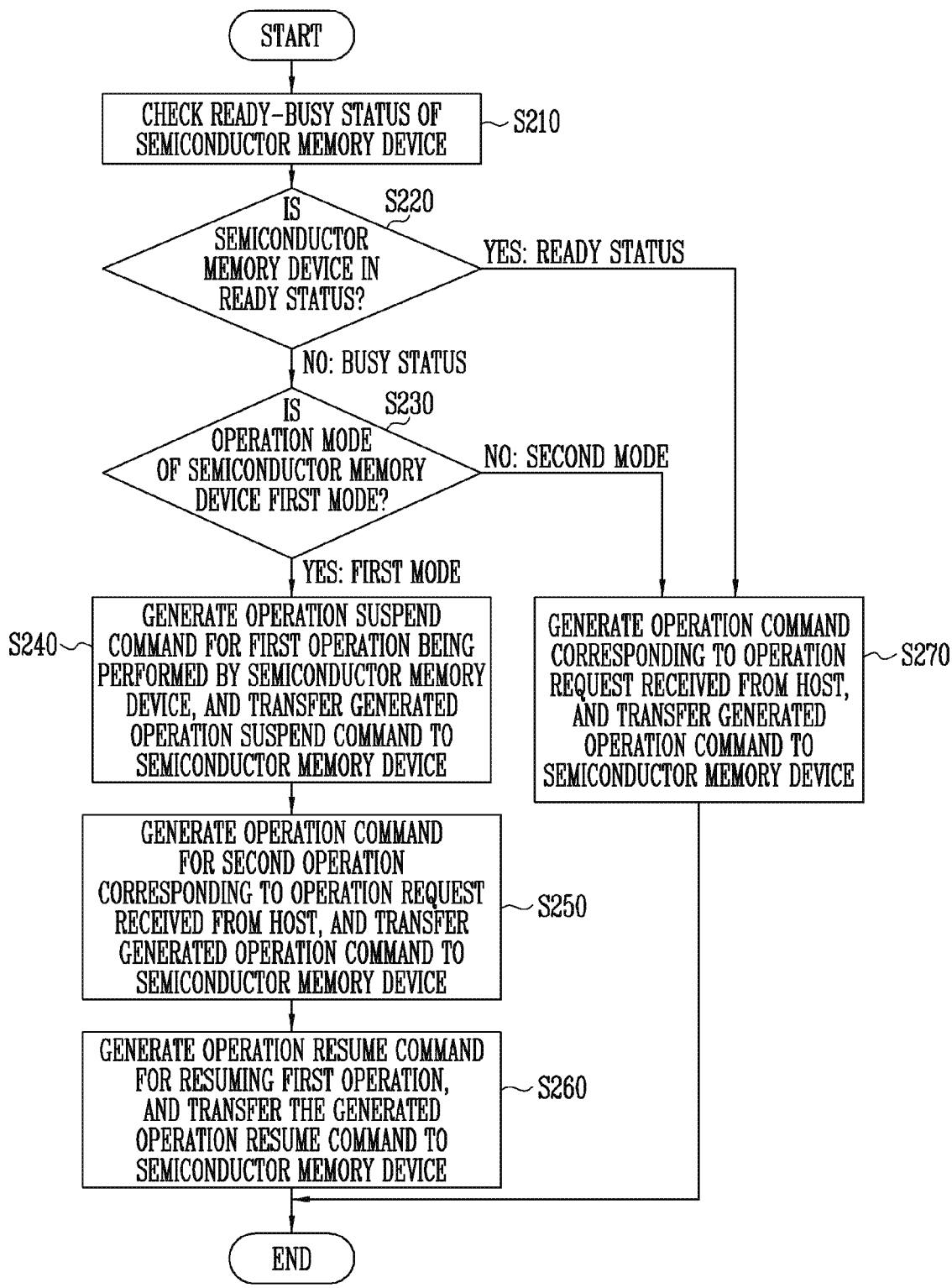

SEMICONDUCTOR MEMORY DEVICE AND CONTROLLER

CROSS-REFERENCE TO RELATED APPLICATION

The present application claims priority under 35 U.S.C. § 119(a) to Korean patent application number 10-2019-0171248, filed on Dec. 19, 2019, in the Korean Intellectual Property Office, the entire disclosure of which is incorporated herein by reference.

BACKGROUND

1. Technical Field

The present disclosure generally relates to an electronic device, and more particularly, to a semiconductor memory device, a controller, and operating methods thereof.

2. Related Art

Semiconductor memory devices may be formed as two-dimensional structures in which strings are arranged horizontally, parallel to a semiconductor substrate, or may be formed as three-dimensional structures in which strings are arranged vertically, perpendicular to a semiconductor substrate. A three-dimensional semiconductor memory device is devised so as to overcome the limit of degree of integration in two-dimensional semiconductor memory devices, and may include a plurality of memory cells vertically stacked on a semiconductor substrate. A controller may control an operation of the semiconductor memory device.

SUMMARY

In accordance with an embodiment of the present disclosure, a semiconductor memory device includes: a memory cell array including a plurality of memory cells; a peripheral circuit configured to perform a first operation, corresponding to a first command, on the memory cell array; and control logic configured to control the first operation performed by the peripheral circuit, wherein the control logic is configured to control the peripheral circuit to suspend the performance of the first operation and perform a second operation corresponding to a second command, in response to the second command being received while the first operation is being performed.

In accordance with another embodiment of the present disclosure, a controller for controlling an operation of a semiconductor memory device includes: a host request receiver configured to receive an operation request from a host; an operation mode determiner configured to store operation mode information of the semiconductor memory device; a ready-busy signal receiver configured to receive a ready-busy signal from the semiconductor memory device; and a command generator configured to generate an operation command corresponding to the operation request, wherein, when the ready-busy signal is in a busy status, the command generator is configured to generate the operation command, based on the operation mode information.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a flowchart illustrating an operating method of the controller in accordance with an embodiment of the present disclosure.

FIG. 9 is a flowchart illustrating an embodiment of a step shown in FIG. 8.

DETAILED DESCRIPTION

Specific structural or functional descriptions disclosed herein are merely illustrative for the purpose of describing embodiments according to the concept of the present disclosure. The embodiments can be implemented in various forms, and should not be construed as being limited to the embodiments set forth herein. Some embodiments a directed toward semiconductor memory devices, controllers, and methods of their operation which result in improved operational speed.

Figure 1:
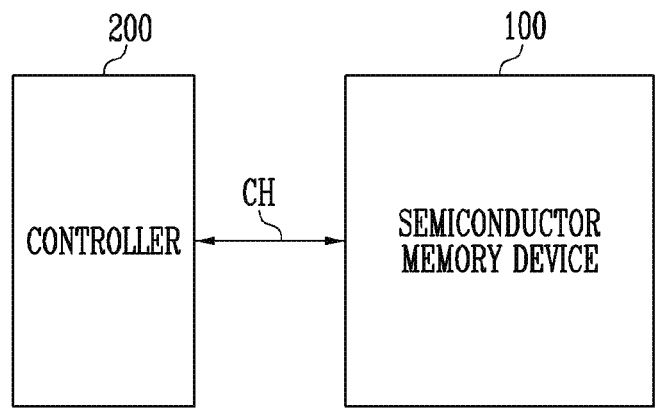
FIG. 1 is a block diagram illustrating a memory system including a semiconductor memory device and a controller.

FIG. 1 is a block diagram illustrating a memory system 10 including a semiconductor memory device 100 and a controller 200.

Referring to FIG. 1, the memory system 10 may include the semiconductor memory device 100 and the controller 200.

The semiconductor memory device 100 operates under the control of the controller 200. The semiconductor memory device 100 includes a memory cell array having a plurality of memory blocks. In an embodiment, the semiconductor memory device 100 may be a flash memory device.

The semiconductor memory device 100 receives a command and an address from the controller 200 through a channel CH, and accesses an area selected by the address in the memory cell array. That is, the semiconductor memory device 100 performs an internal operation corresponding to the command on the area selected by the address.

For example, the semiconductor memory device 100 may perform a program operation, a read operation, and an erase operation. In the program operation, the semiconductor memory device 100 may program data in the area selected by the address. In the read operation, the semiconductor memory device 100 may read data from the area selected by the address. In the erase operation, the semiconductor memory device 100 may erase data stored in the area selected by the address.

The semiconductor memory device 100 may include a status register (not shown). The status register may store a value representing whether the semiconductor memory device 100 corresponds to a ready status or corresponds to a busy status. The status register outputs, to the controller 200, a ready-busy signal representing whether the semiconductor memory device 100 corresponds to the ready status or corresponds to the busy status.

That the semiconductor memory device 100 corresponds to the ready status may mean that the corresponding semiconductor memory device 100 is standing by after the corresponding semiconductor memory device 100 completes an internal operation. For example, that the semiconductor memory device 100 corresponds to the ready status may mean that the corresponding semiconductor memory device 100 has completed a program, read or erase operation corresponding to a command. The ready-busy signal outputs a value representing the "ready status."

That the semiconductor memory device 100 corresponds to the busy status may mean that the corresponding memory device 100 is still performing an internal operation. For example, that the semiconductor memory device 100 corresponds to the busy status may mean that the corresponding semiconductor memory device 100 is still performing a program, read or erase operation corresponding to a command. The ready-busy signal outputs a value representing the "busy status."

In an embodiment of the present disclosure, when the semiconductor memory device 100 is in the busy status because a first operation of the semiconductor memory device 100 is not completed, the controller 200 may transfer any one of a command for a second operation and an operation suspend command to the semiconductor memory device 100 according to an operation mode of the semiconductor memory device 100.

For example, when the operation mode of the semiconductor memory device 100 is set as a first mode, the controller 200 may generate the operation suspend command and transfer the operation suspend command to the semiconductor memory device 100, when the semiconductor memory device 100 is in the busy status. Subsequently, the controller 200 may generate an operation command for performing the second operation and transfer the operation command to the semiconductor memory device 100. After the performance of the second operation is completed, the controller 200 may generate an operation resume command for resuming the first operation, and transfer the operation resume command to the semiconductor memory device 100.

In an embodiment of the present disclosure, the semiconductor memory device 100 may suspend the first operation in response to the operation suspend command from the controller 200. Also, the semiconductor memory device 100 may perform the second operation in response to the operation command for performing the second operation. The semiconductor memory device 100 may resume the performance of the first operation in response to the operation resume command received from the controller 200 after the second operation is completed.

Meanwhile, when the operation mode of the semiconductor memory device is set as a second mode, the controller 200 may generate the operation command for performing the second operation and transfer the operation command to the semiconductor memory device 100, when the semiconductor memory device 100 is in the busy status. In response to the reception of the operation command for performing the second operation, the semiconductor memory device 100 may suspend the performance of the first operation, perform the second operation, and resume the first operation after the performance of the second operation is completed.

In an embodiment of the present disclosure, the semiconductor memory device 100 may receive a command for performing the second operation different from the first operation from the controller 200 even when the semiconductor memory device 100 is in the busy status because the first operation being currently performed is not completed. The semiconductor memory device 100 suspends the first operation and performs the second operation, in response to the reception of the command. After the performance of the second operation is completed, the semiconductor memory device resumes the performance of the first operation.

Figure 2:
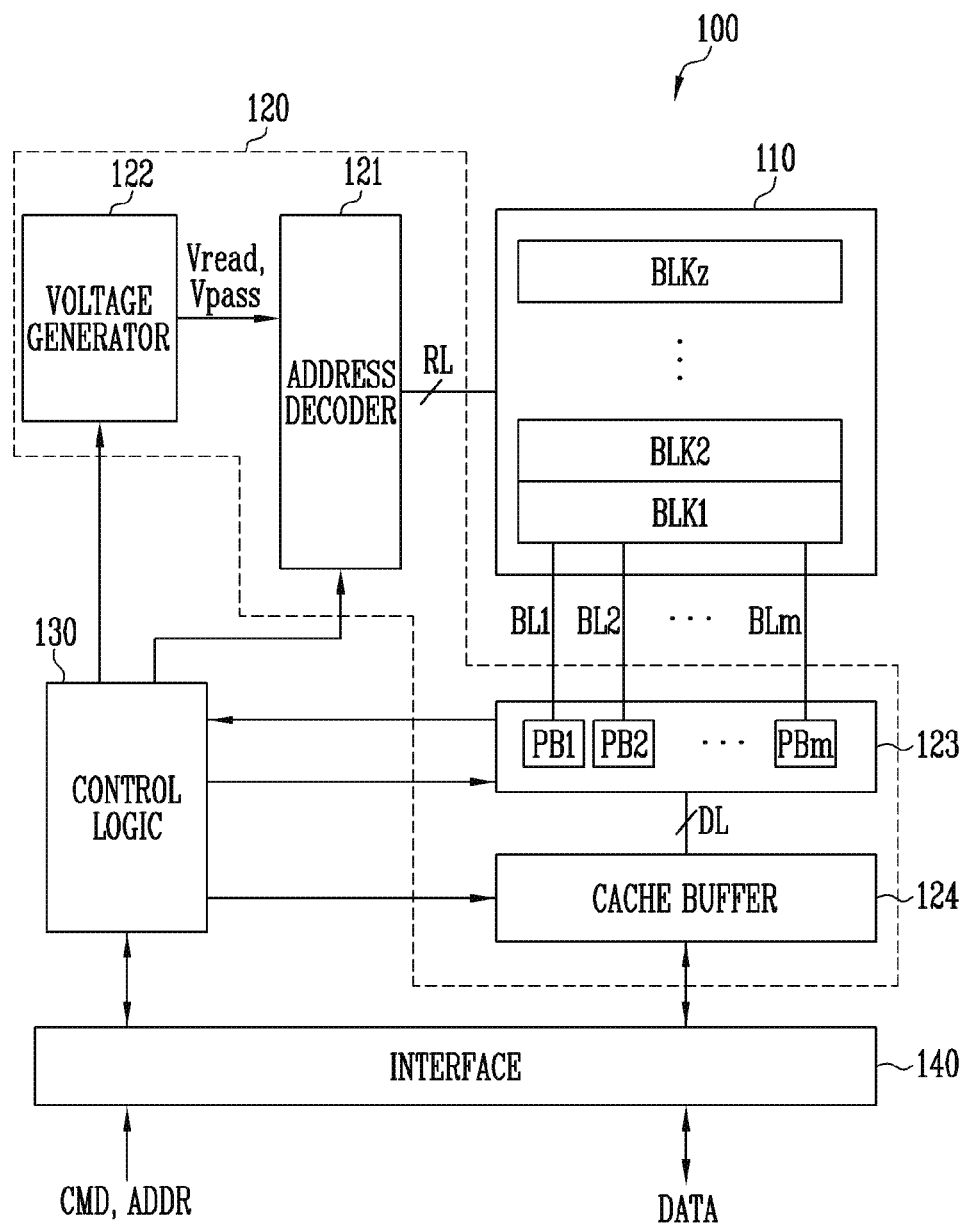
FIG. 2 is a block diagram illustrating a structure of the semiconductor memory device shown in FIG. 1.

FIG. 2 is a block diagram illustrating a structure of the semiconductor memory device 100 shown in FIG. 1.

Referring to FIG. 2, the semiconductor memory device 100 may include a memory cell array 100, a peripheral circuit 120, control logic 130, and an interface 140. The peripheral circuit 120 may include an address decoder 121, a voltage generator 122, a read/write circuit 123, and a cache buffer 124.

The memory cell array 110 may be coupled to the address decoder 121 through row lines RL. The row lines RL may include source select lines SSL, word lines WL, and drain select lines DSL. Meanwhile, the memory cell array 100 may be coupled to the read/write circuit 123 through bit lines BL.

The memory cell array 110 includes a plurality of memory blocks BLK1 to BLKz. The plurality of memory blocks BLK1 to BLKz are coupled to the address decoder 121 through the row lines RL. The plurality of memory blocks BLK1 to BLKz are coupled to the read/write circuit 123 through bit lines BL1 to BLm. Each of the plurality of memory blocks BLK1 to BLKz includes a plurality of memory cells. In an embodiment, the plurality of memory cells are nonvolatile memory cells. Memory cells coupled to the same word line among the plurality of memory cells are defined as one page. That is, the memory cell array 110 is configured with a plurality of pages.

Each of the memory cells of the semiconductor memory device 100 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

Figure 3:
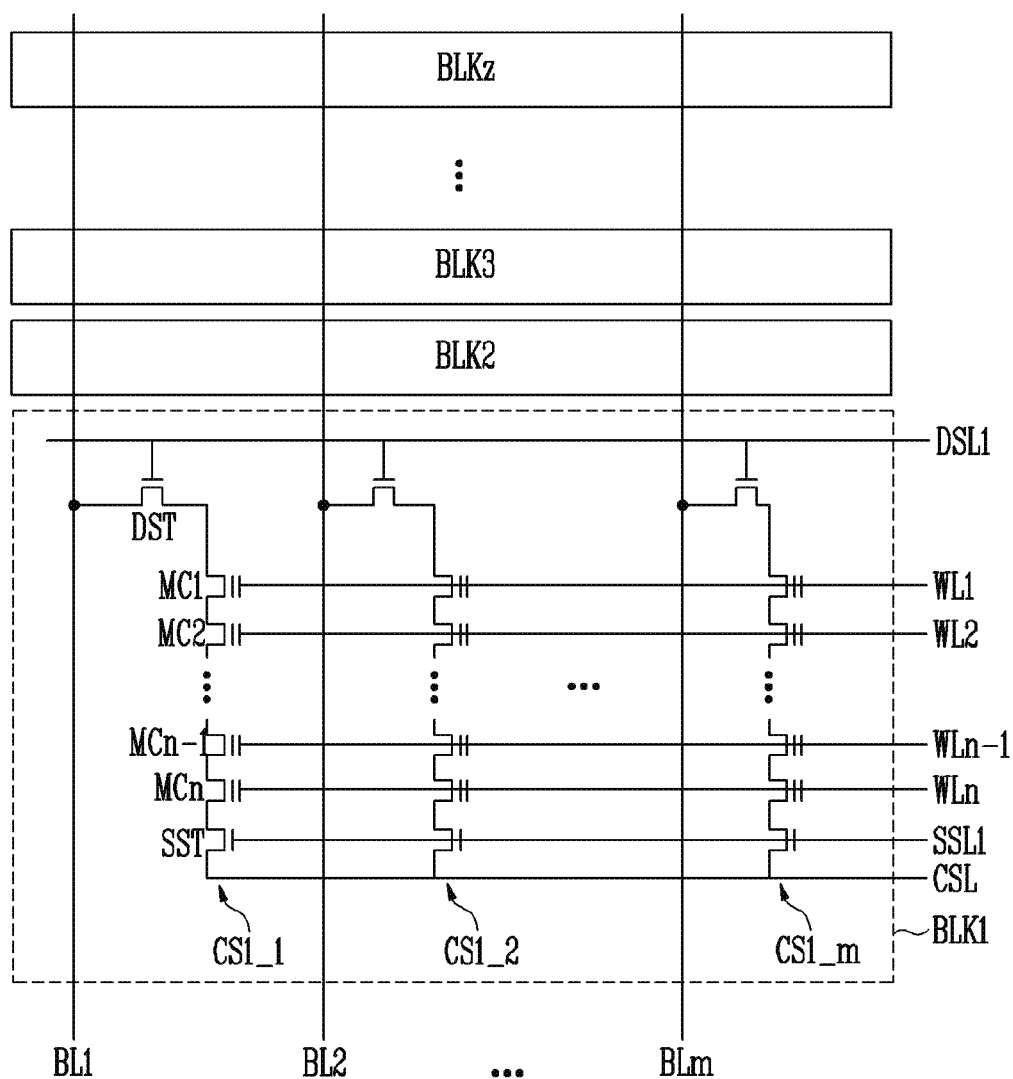
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, first to zth memory blocks BLK1 to BLKz included in a memory cell array 110_1 are commonly coupled to first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 includes a plurality of cell strings CS1_1 to CS1_m. First to mth cell strings CS1_1 to CS1_m are respectively coupled to the first to mth bit lines BL1 to BLm.

Each of the first to mth cell strings CS1_1 to CS1_m includes a drain select transistor DST, a plurality of memory cells MC1 to MCn coupled in series, and a source select transistor SST. The drain select transistor DST is coupled to a drain select line DSL. First to nth memory cells MC1 to MCn are respectively coupled to first to nth word lines WL1 to WLn. The source select transistor SST is coupled to a source select line SSL1. A drain side of the drain select transistor DST is coupled to a corresponding bit line. The drain select transistors of the first to mth cell strings CS1_1 to CS1_m are respectively coupled to the first to mth bit lines BL1 to BLm. A source side of the source select transistor SST is coupled to a common source line CSL. In an embodiment, the common source line CSL may be commonly coupled to the first to zth memory blocks BLK1 to BLKz.

The drain select line DSL, the first to nth word lines WL1 to WLn, and the source select line SSL are included in the row line RL shown in FIG. 2. The drain select line DSL, the first to nth word lines WL1 to WLn, and the source select line SSL are controlled by the address decoder 121. The common source line CSL is controlled by the control logic 130. The first to mth bit lines BL1 to BLm are controlled by the read/write circuit 123.

Referring back to FIG. 2, the peripheral circuit 120 may include the address decoder 121, the voltage generator 122, the read/write circuit 123, and the cache buffer 124.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The address decoder 121 operates under the control of the control logic 130. The address decoder 121 receives an address ADDR from the control logic 130 through an input/output buffer (not shown) in the semiconductor memory device 100.

The address decoder 121 decodes a block address in the received address ADDR. The address decoder 121 selects at least one memory block among the memory blocks BLK1 to BLKz according to the decoded block address. The address decoder 121 decodes a row address in the received address ADDR. The address decoder 121 may select at least one word line of the selected memory block by applying voltages provided from the voltage generator 122 to at least one word line WL according to the decoded row address.

In a program operation, the address decoder 121 may apply a program voltage to the selected word line, and apply a pass voltage lower than the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line.

In an embodiment, an erase operation of the semiconductor memory device 100 is performed in a unit of a memory block. An address ADDR input to the semiconductor memory device 100 in an erase operation includes a block address. The address decoder 121 may decode the block address, and select one memory block according to the decoded block address. In the erase operation, the address decoder 121 may apply a ground voltage to the selected word line of the selected memory block.

In an embodiment, the address decoder 121 may decode a column address in the transferred address ADDR. The decoded column address may be transferred to the read/write circuit 123. In an example, the address decoder 121 may include components such as a row decoder, a column decoder, and an address buffer.

The voltage generator 122 generates a plurality of voltages by using an external power voltage supplied to the semiconductor memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operating voltage of the semiconductor memory device 100.

In an embodiment, the voltage generator 122 may generate a plurality of voltages by using the external power voltage or the internal power voltage. The voltage generator 122 may generate various voltages required from the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors which receive the internal power voltage, and generate a plurality of voltages by selectively activating the plurality of pumping capacitors under the control of the control logic 130.

The plurality of generated voltages may be supplied to the memory cell array 110 by the address decoder 121.

The read/write circuit 123 includes first to mth page buffers PB1 to PBm. The first to mth page buffers PB1 to PBm are coupled to the memory cell array 110 respectively through the first to mth bit lines BL1 to BLm. The first to mth page buffers PB1 to PBm operate under the control of the control logic 130.

The first to mth page buffers PB1 to PBm is coupled to the cache buffer 124. More specifically, the cache buffer 124 may include cache latches corresponding to each of the first to mth page buffers PB1 to PBm.

In a program operation, data received to the semiconductor memory device 100 through the interface 140 is temporarily stored in the cache buffer 124. Subsequently, the data DATA stored in the cache buffer 124 may be transferred to the first to mth page buffers PB1 to PBm. Memory cells of a selected page are programmed according to the data DATA transferred to the first to mth page buffers PB1 to PBm. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) is applied may be maintained. In a program verify operation, the first to mth page buffers PB1 to PBm read page data from selected memory cells through the bit lines BL1 to BLm.

In a read operation, the first to mth page buffers PB1 to PBm included in the read/write circuit 123 read data DATA from the memory cells of the selected page through the bit lines BL. The read data DATA is transferred to the cache buffer 124 from the first to mth page buffers PB1 to PBm. The data stored in the cache buffer 124 may be output to the controller 200 according to a data output command.

In an erase operation, the read/write circuit 123 may float the bit lines BL. In an embodiment, the read/write circuit 123 may include a column select circuit.

The cache buffer 124 is coupled to the first to mth page buffers PB1 to PBm through data lines DL. The cache buffer 124 operates under the control of the control logic 130. The cache buffer 124 temporarily stores data DATA received from an external controller (not shown). In a read operation, the cache buffer 124 temporarily stores data transferred from the first to mth page buffers PB1 to PBm included in the read/write circuit 123 and then outputs the stored data to the external controller.

The control logic 130 may be coupled to the address decoder 121, the voltage generator 122, the read/write circuit 123, and the cache buffer 124. The control logic 130 may control overall operations of the semiconductor memory device 100. The control logic 130 may operate in response to a command CMD transferred from an external device.

The control logic 130 outputs a status signal representing whether the semiconductor memory device 100 corresponds to a ready status or corresponds to a busy status. For example, the control logic 130 may output the status signal to the interface 140. The interface 140 may output any one of a ready signal and a busy signal through a ready-busy line according to the received status signal. The control logic 130 may be implemented as hardware, software, or a combination of hardware and software. For example, the control logic 130 may be a control logic circuit operating in accordance with an algorithm and/or a processor executing control logic code.

That the semiconductor memory device 100 corresponds to the ready status may mean that the corresponding semiconductor memory device 100 is standing by after the corresponding semiconductor memory device 100 completes an internal operation. For example, that the semiconductor memory device 100 corresponds to the ready status may mean that the corresponding semiconductor memory device 100 has completed a program, read or erase operation corresponding to a command.

That the semiconductor memory device 100 corresponds to the busy status may mean that the corresponding memory device 100 is still performing an internal operation. For example, that the semiconductor memory device 100 corresponds to the busy status may mean that the corresponding semiconductor memory device 100 is still performing a program, read or erase operation corresponding to a command.

The interface 140 may interface data communication between the semiconductor memory device 100 and the external device. The interface 140 may include a NAND interface or a NOR interface according to a kind of the semiconductor memory device 100.

Figure 4:
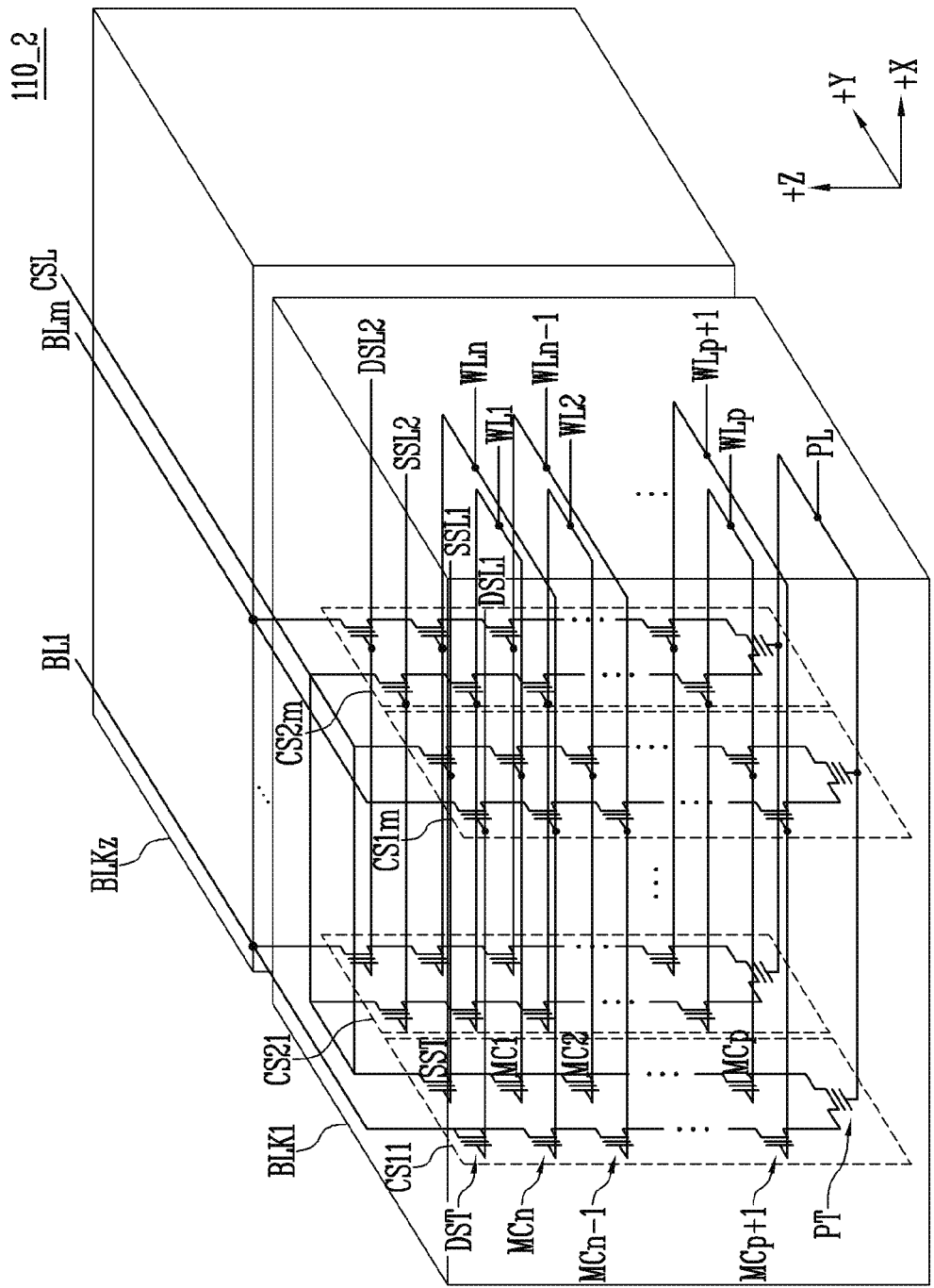
FIG. 4 is a diagram illustrating another embodiment of the memory cell array shown in FIG. 2.

FIG. 4 is a diagram illustrating another embodiment of the memory cell array 110 shown in FIG. 2.

Referring to FIG. 4, a memory cell array 1102 includes a plurality of memory blocks BLK1 to BLKz. In FIG. 4, for convenience of description, an internal configuration of a first memory block BLK1 Is illustrated, and internal configurations of the other memory blocks BLK2 to BLKz are omitted. It will be understood that second to zth memory blocks BLK2 to BLKz are configured identically to the first memory block BLK1.

The first memory block BLK1 includes a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the first memory block BLK1, m cell strings are arranged in a row direction (i.e., a +X direction). In FIG. 4, a case where two cell strings are arranged in a column direction (i.e., a +Y direction) is illustrated. However, this is for convenience of description, and it will be understood that three or more cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

In an embodiment, at least one of the first to nth memory cells MC1 to MCn may be used as a dummy memory cell. When the dummy memory cell is provided, a voltage or current of a corresponding cell string can be stably controlled. Accordingly, the reliability of data stored in the memory block BLK1 is improved.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

Figure 5:
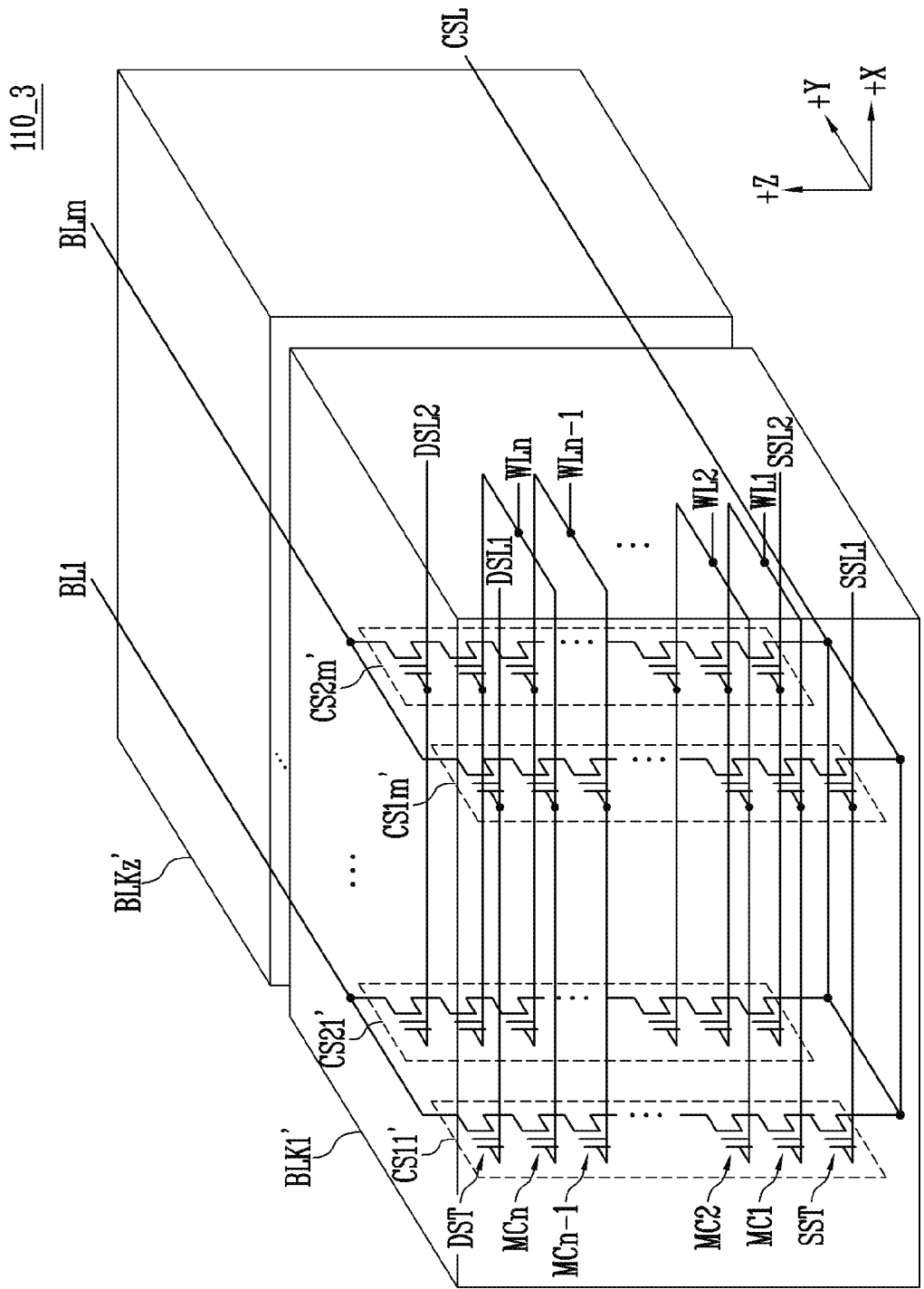
FIG. 5 is a diagram illustrating still another embodiment of the memory cell array shown in FIG. 2.

FIG. 5 is a diagram illustrating still another embodiment of the memory cell array 110 shown in FIG. 2.

Referring to FIG. 5, a memory cell array 1103 includes a plurality of memory blocks BLK1' to BLKz'. In FIG. 5, for convenience of description, an internal configuration of a first memory block BLK1' is illustrated, and internal configurations of the other memory blocks BLK2' to BLKz' are omitted. It will be understood that second to zth memory blocks BLK2' to BLKz' are configured identically to the first memory block BLK1'.

The first memory block BLK1' includes a plurality of cell strings CS11' to CS1m' and CS21' to CS2m'. Each of the plurality of cell strings CS11 to CS1m' and CS21' to CS2m' may extend along a +Z direction. In the first memory block BLK1', m cell strings are arranged in a +X direction. In FIG. 5, a case where two cell strings are arranged in a +Y direction is illustrated. However, this is for convenience of description, and it will be understood that three or more cell strings may be arranged in the +Y direction.

Each of the plurality of cell strings CS11' to CS1m' and CS21' to CS2m' includes at least one source select transistor SST, first to nth memory cells MC1 to MCn, and at least one drain select transistor DST.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

In an embodiment, at least one of the first to nth memory cells MC1 to MCn may be used as a dummy memory cell. When the dummy memory cell is provided, a voltage or current of a corresponding cell string can be stably controlled. Accordingly, the reliability of data stored in the memory block BLK1' is improved.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLK1' shown FIG. 5 has a circuit similar to that of the memory block BLK1 shown in FIG. 4, except that the pipe transistor PT is excluded from each cell string shown in FIG. 5.

Figure 6:
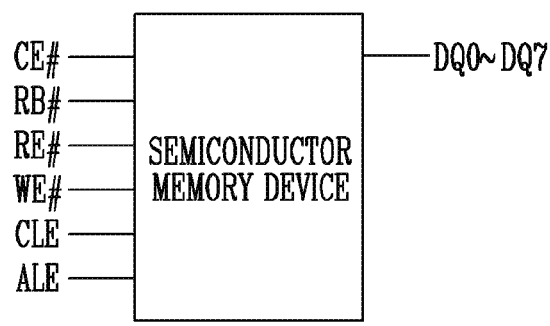
FIG. 6 is a diagram illustrating a pin configuration of the semiconductor memory device.

FIG. 6 is a diagram illustrating a pin configuration of the semiconductor memory device 100.

Referring to FIG. 6, the semiconductor memory device 100 communicates with an external controller through a plurality of lines.

The semiconductor memory device 100 communicates with the controller through a chip enable CE # line, a command latch enable CLE line, an address latch enable ALE line, a write enable WE # line, a read enable RE # line, a ready-busy RB # line, and data input/output DQ0 to DQ7 lines.

A signal of the chip enable CE # line indicates that the corresponding semiconductor memory device 100 can operate. The signal of the chip enable CE # line may be selectively applied to storage devices coupled to the same channel. The signal of the chip enable CE #line may decrease to a low level to represent that all operations can be performed in a corresponding chip. When the signal of the chip enable CE # line is at a high level, the corresponding chip may be in a standby status.

A signal of the ready busy RB # line decreases to a low level while an operation is being performed in the chip, so that the chip is prevented from exchanging another signal with an external device. When the signal of the ready busy RB # line is at a high level, this indicates that the chip is in a ready status.

A command latch enable CLE signal is at a high level while a command CMD is being input to a storage device. The address latch enable ALE signal is at a high level while an address ADD is being input to the storage device.

The command CMD and the address ADD are input to the storage device when the write enable WE # signal is changed from a high level to a low level.

The write enable WE # signal toggles when a command and an address are loaded on the storage device, and the read enable RE # signal may toggle when data is loaded onto the controller.

The data input/output DQ0 to DQ7 lines input a command, an address, and data to the semiconductor memory device 100, or output data from the semiconductor memory device 100 to the controller. Because data is configured with eight bits, a number of the data input/output DQ0 to DQ7 lines is also eight. However, the number of the data input/output DQ0 to DQ7 lines is not limited to eight. In various embodiments, the number of the data input/output DQ0 to DQ7 lines may be extended to 16 or 32.

Figure 7:
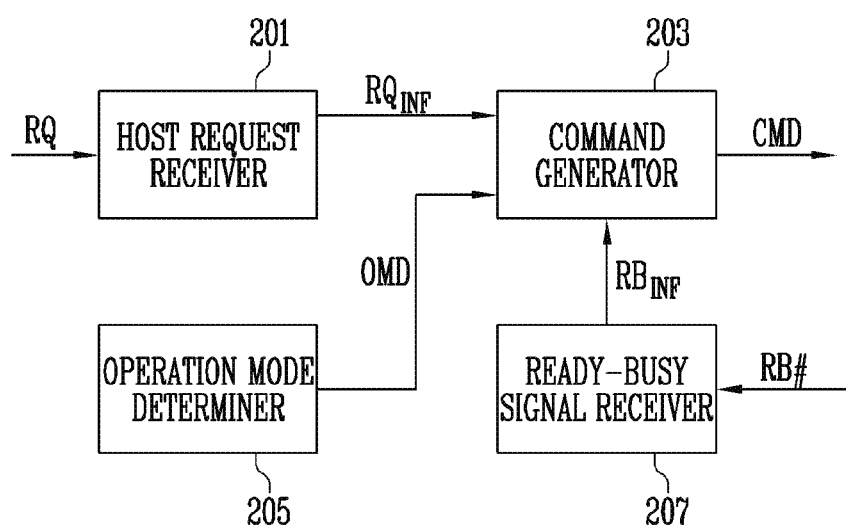
FIG. 7 is a block diagram illustrating an embodiment of the controller shown in FIG. 1.

FIG. 7 is a block diagram illustrating an embodiment of the controller 200 shown in FIG. 1.

Referring to FIG. 7, the controller 200 may include a host request receiver 201, a command generator 203, an operation mode determiner 205, and a ready-busy signal receiver 207.

The host request receiver 201 may receive an operation request RQ for a specific operation of the memory system 10 from a host. For example, the operation request RQ may be a data write request for storing data in the semiconductor memory device 100 in the memory system 10 or a data read request for reading data stored in the semiconductor memory device 100 in the memory system 10. The host request receiver 201 may generate request information $RQ_{INF}$ corresponding to the received operation request RQ, and transfer the generated request information $RQ_{INF}$ to the command generator 203. The request information $RQ_{INF}$ may be information for identifying which operation the received operation request RQ is a request for performing. The command generator 203 may generate a command CMD, based on the received request information $RQ_{INF}$.

The operation mode determiner 205 may store operation mode information OMD as information on an operation mode of the semiconductor memory device 100. In an example, the semiconductor memory device 100 may operate in any one of a first mode and a second mode. In the first mode, the controller 200 may generate an operation suspend command and transfer the generated operation suspend command to the semiconductor memory device 100 so as for the semiconductor memory device 100 to preferentially perform a second operation while the semiconductor memory device 100 is performing a specific operation, e.g., a first operation (in the busy status). When the semiconductor memory device 100 receives the operation suspend command while the semiconductor memory device 100 is performing the first operation, the semiconductor memory device 100 suspends the operation being performed. When the semiconductor memory device 100 suspends the operation, the controller 200 may transfer, to the semiconductor memory device 100 an operation command corresponding to the second operation. The semiconductor memory device 100 may perform the second operation in response to the received operation command. When the performance of the second operation is completed, the controller 200 may generate an operation resume command for resuming the first operation which has been suspended, and transfer the generated operation resume command to the semiconductor memory device 100. The semiconductor memory device 100 may resume the first operation in response to the received operation resume command. In an embodiment, the first operation may be an erase operation or a program operation. Meanwhile, the second operation may be a read operation. The operation command which allows the semiconductor memory device 100 to perform the second operation may be a read command.

In the second mode, the controller 200 does not generate the operation suspend command, but may generate an operation command for the second operation and transfer the generated operation command to the semiconductor memory device 100 so as for the semiconductor memory device 100 to preferentially perform the second operation while the semiconductor memory device 100 is performing a specific operation, e.g., the first operation (in the busy status). When the semiconductor memory device 100 receives the operation command while the semiconductor memory device 100 is performing the first operation, the semiconductor memory device 100 may suspend the operation being performed. Subsequently, the semiconductor memory device 100 may perform the second operation corresponding to the received operation command. After the performing of the second operation is completed, the semiconductor memory device 100 may resume the performance of the first operation.

That is, in the first mode, the controller 200 may sequentially generate the operation suspend command, a second command, and the operation resume command and transfer the generated commands to the semiconductor memory device 100 so as for the semiconductor memory device 100 to suspend the first operation in a situation in which the semiconductor memory device 100 is in the busy status and perform the second operation. The first mode may be a mode which allows the semiconductor memory device 100 more stably operate.

On the other hand, in the second mode, the controller 200 may generate only the second command and transfer the generated second command to the semiconductor memory device 100 so as for the semiconductor memory device 100 to suspend the first operation in a situation in which the semiconductor memory device 100 is in the busy status and perform the second operation. The second mode may be a mode which allows the semiconductor memory device 100 to operate at a faster speed.

The operation mode determiner 205 may store operation mode information OMD as information representing in which one of the first mode and the second mode the semiconductor memory device 100 operates. The operation mode of the semiconductor memory device 100 may be changed depending on various conditions. The operation mode determiner 205 may transfer the operation mode information OMD to the command generator 203.

The ready-busy signal receiver 207 may receive a ready-busy signal RB # from the semiconductor memory device 100. The ready-busy signal receiver 207 may generate ready-busy information $RB_{INF}$ corresponding to the received ready-busy signal RB #, and transfer the generated ready-busy information $RB_{INF}$ to the command generator 203. The ready-busy information $RB_{INF}$ may be information for identifying whether the received ready-busy signal RB # represents the ready status or represents the busy status.

The command generator 203 may generate a command CMD according to the operation request RQ, based on the operation mode information OMD received from the operation mode determiner 205 and the ready-busy information $RB_{INF}$ received from the ready-busy signal receiver 207.

For example, when the semiconductor memory device 100 is currently in the ready status as a result obtained by referring to the ready-busy information $RB_{INF}$, the command generator 203 may generate a command CMD corresponding to the operation request RQ and transfer the generated command CMD to the semiconductor memory device 100.

In another example, when the semiconductor memory device 100 is currently in the busy status as a result obtained by referring to the ready-busy information $RB_{INF}$, the command generator 203 may generate a command according to the operation mode information OMD.

When the operation mode of the semiconductor memory device 100 is the first mode as a result obtained by referring to the operation mode information OMD in the situation in which the semiconductor memory device 100 is currently in the busy status, the command generator 203 generates an operation suspend command and transfer the generated operation suspend command to the semiconductor memory device 100. The semiconductor memory device 100 may suspend the operation which is being performed in response to the received operation suspend command. Accordingly, the status of the semiconductor memory device 100 may be changed from the busy status to the ready status. When the status of the semiconductor memory device 100 is changed to the ready status, the command generator 203 generates a command corresponding to the operation request RQ received from the host, and transfers the generated command to the semiconductor memory device 100. The semiconductor memory device 100 may perform an operation corresponding to the received command. Accordingly, the status of the semiconductor memory device is changed from the ready status to the busy status. When the semiconductor memory device 100 completes the operation corresponding to the received command, the status of the semiconductor memory device 100 may be changed from the busy status to the ready status. When the status of the semiconductor memory device 100 is changed to the ready status, the command generator 203 generates an operation resume command for resuming the operation which has been suspended, and transfers the generated operation resume command to the semiconductor memory device 100. The semiconductor memory device 100 resumes the operation which has been suspended, in response to the received operation resume command.

When the operation mode of the semiconductor memory device 100 is the second mode as a result obtained by referring to the operation mode information OMD in the situation in which the semiconductor memory device 100 is currently in the busy status, the command generator 203 may generate a command CMD corresponding to the operation request RQ, and transfer the generated command CMD to the semiconductor memory device 100. The semiconductor memory device 100 suspends the operation which is being performed in response to the received command, performs an operation corresponding to the received command CMD, and then resumes the performance of the operation which has been suspended.

FIG. 8 is a flowchart illustrating an operating method of the controller 200 in accordance with an embodiment of the present disclosure.

Referring to FIG. 8, the controller 200 receives an operation request RQ from the host (S110). The step S110 may be performed by the host request receiver 201. Subsequently, in step S130, the controller 200 checks an operation mode of the semiconductor memory device 100. The step S130 may be performed by the command generator 203. The command generator 203 may check an operation mode of the semiconductor memory device 100 by referring to operation mode information OMD received from the operation mode determiner 205. The operation mode may be a first mode or a second mode. Subsequently, in step S150, the controller 200 transfers an operation command corresponding to the operation request RQ received from the host to the semiconductor memory device 100, based on the operation mode of the semiconductor memory device 100. A more detailed configuration of the step S150 will be described later with reference to FIG. 9.

FIG. 9 is a flowchart illustrating an embodiment of the step S150 shown in FIG. 8.

Referring to FIG. 9, in the step S150, the controller 200 checks a ready-busy status of the semiconductor memory device 100 (S210). The step S210 may be performed by the command generator 203. The command generator 203 may check the ready-busy status of the semiconductor memory device 100, based on a ready-busy signal RB #received through the ready-busy signal receiver 207.

In step S220, the controller 200 determines whether the semiconductor memory device 100 is in a ready status. As a determination result of the step S220, when the semiconductor memory device 100 is in a busy status (S220) (No), the controller 200 determines whether the operation mode of the semiconductor memory device 100 is the first mode (S230). When the operation mode of the semiconductor memory device 100 is the first mode (S230) (Yes), the controller 200 generates an operation suspend command for a first operation being performed by the semiconductor memory device 100, and transfers the generated operation suspend command to the semiconductor memory device 100 (S240). When the step S240 is performed, the semiconductor memory device 100 which receives the operation suspend command may suspend the performance of the first operation. When the performance of the first operation is suspended, the status of the semiconductor memory device 100 may be changed from the busy status to the ready status.

When the status of the semiconductor memory device 100 is to changed to the ready status, the controller 200 generates an operation command for a second operation corresponding to the operation request RQ received from the host in the step S110 shown in FIG. 8, and transfers the generated operation command to the semiconductor memory device 100 (S250). When the step S250 is performed, the semiconductor memory device 100 which receives the operation command may perform an operation corresponding to the operation command received from the host. When the performance of the operation is started, the status of the semiconductor memory device 100 may be changed from the ready status to the busy status. When the operation is completed, the status of the semiconductor memory device may be again changed from the busy status to the ready status.

When the status of the semiconductor memory device 100 is again changed to the ready status, the controller 200 generates an operation resume command for resuming the first operation which has been suspended, and transfers the generated operation resume command to the semiconductor memory device 100 (S260). The semiconductor memory device 100 may resume the performance of the first operation which has been suspended, in response to the received operation resume command.

As a determination result of the step S230, when the operation mode of the semiconductor memory device 100 is the second mode (S230) (No), the controller 200 generates an operation command corresponding to the operation request received from the host, and transfers the generated operation command to the semiconductor memory device 100 (S270). The semiconductor memory device 100 may suspend the first operation being performed in response to the received operation command, perform an operation corresponding to the received operation command, and then resume the performance of the first operation which has been suspended.

Meanwhile, as a determination result of the step S220, when the semiconductor memory device 100 is in the ready status (S220) (Yes), the controller 220 generates an operation command corresponding to the operation request received from the host, regardless of the operation mode, and transfers the generated operation command to the semiconductor memory device 100 (S270).

Figure 10A:
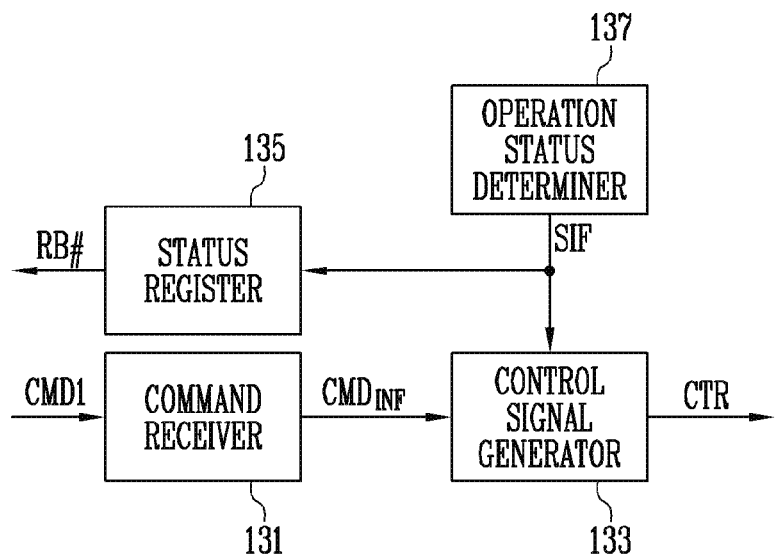
FIG. 10A is a block diagram illustrating an embodiment of a control logic shown in FIG. 2.

FIG. 10A is a block diagram illustrating an embodiment of the control logic 130 shown in FIG. 2.

Referring to FIG. 10A, the control logic 130 may include a command receiver 131, a control signal generator 133, a status register 135, and an operation status determiner 137.

The command receiver 131 receives a command CMD1 from the controller 100 and transfers the received command CMD1 to the control signal generator 133.

The operation status determiner 137 determines an operation status of the semiconductor memory device 100, and generates status information SIF representing the determined operation status. The status information SIF may be information representing whether the semiconductor memory device 100 is in a status (busy status) in which an operation of the semiconductor memory device 100 is being currently performed or is in a status (ready status) in which the operation of the semiconductor memory device 100 is completed. The status information SIF is transferred to the status register 135 and the control signal generator 133.

The control signal generator 133 may generate a control signal CTR, based on the status information SIF and command information $CMD_{INF}$. The control signal CTR may be a signal for controlling a general operation of the semiconductor memory device 100. For example, the control signal CTR may be a signal for controlling a read operation, a program operation, or an erase operation of the peripheral circuit 120 shown in FIG. 2.

The status register 135 stores a value representing an operation status of the semiconductor memory device 100. The status register 135 updates the value representing the operation status of the semiconductor memory device 100, based on the status information received from the operation status determiner 137. The status register 135 generates a ready-busy signal RB #, based on the stored value. The generated ready-busy signal RB # is transferred to the controller 200.

When the status information SIF is information representing the ready status, the control signal generator 133 generates a control signal CTR for performing an operation corresponding to the command CMD1 transferred from the controller 200. More specifically, the control signal generator 133 generates the control signal CTR for performing the operation corresponding to the command CMD1 transferred from the controller 200, based on the command information $CMD_{INF}$ received from the command receiver 131.

When the status information SIF is information representing the busy status, and the command CMD is an operation suspend command, the control signal generator 133 may generate a control signal for suspending an operation being performed. When the operation being performed is suspended, the status information SIF may be changed to represent the ready status, and accordingly, the value stored in the status register 135 may also be changed to represent the ready status. Therefore, the controller 200 may transfer, to the semiconductor memory device 100, a command, e.g., a read command corresponding to an operation to be preferentially performed. The read command is transferred to the control signal generator 133 through the command receiver 131. The control signal generator 133 may generate a control signal CTR for performing an operation corresponding to the received read command. When the read operation is completed, the controller 200 may transfer an operation resume command to the semiconductor memory device 100. The operation resume command is transferred to the control signal generator 133 through the command receiver 131. The control signal generator 133 may generate a control signal CTR for resuming the operation which has been suspended, in response to the received operation resume command.

When the status information SIF is information representing the busy status, and the command CMD is a command for a specific operation, the control signal generator 133 may generate a control signal CTR for suspending an operation being currently performed by the semiconductor memory device 100. For example, when the semiconductor memory device 100 performs an erase operation, the status information SIF may represent the busy status of the semiconductor memory device 100. In this situation, when the control signal generator 133 receives a read command, the control signal generator 133 may suspend the erase operation being currently performed, and generate a control signal CTR for performing a read operation. Subsequently, when the read operation is completed, the control signal generator 133 generates a control signal CTR for resuming the erase operation which has been suspended. Accordingly, the peripheral circuit 120 may resume the erase operation.

Figure 10B:
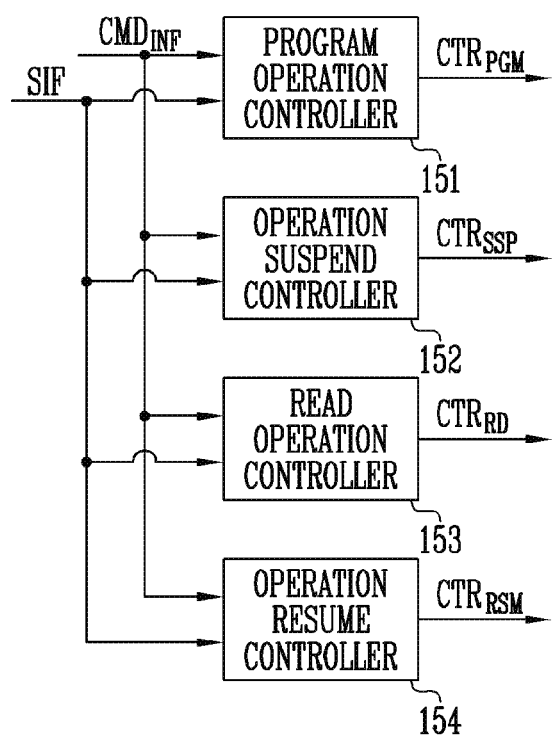
FIG. 10B is a block diagram illustrating an embodiment of a control signal generator shown in FIG. 10A.

FIG. 10B is a block diagram illustrating an embodiment of the control signal generator 133 shown in FIG. 10A.

Referring to FIG. 10B, the control signal generator 133 may include a program operation controller 151, an operation suspend controller 152, a read operation controller 153, and an operation resume controller 154. The program operation controller 151 may generate a program control signal $CTR_{PGM}$ for controlling a program operation of the peripheral circuit 120, based on the status information SIF and the command information $CMD_{INF}$. The operation suspend controller 152 may generate a suspend control signal $CTR_{SSP}$ for suspending an operation being currently performed by the peripheral circuit 120, based on the status information SIF and the command information $CMD_{INF}$. The read operation controller 153 may generate a read control signal $CTR_{RD}$ for controlling a read operation of the peripheral circuit 120, based on the status information SIF and the command information $CMD_{INF}$. The operation resume controller 154 may generate a resume control signal $CTR_{RSM}$ for resuming the operation which has been suspended under the control of the operation suspend controller 152, based on the status information SIF and the command information $CMD_{INF}$.

For example, when the command information $CMD_{INF}$ represents the program operation, and the status information SIF represent the ready status of the semiconductor memory device 100, the program operation controller 151 may generate the program control signal $CTR_G$ for controlling the program operation of the peripheral circuit 120.

The status information SIF may represent the busy status of the semiconductor memory device 100 while the program operation is being performed. When the received command information $CMD_{INF}$ represents a read command, the operation suspend controller 152 may generate the suspend control signal $CTR_{SSP}$ for suspending the program operation being currently performed. When the program operation is suspended, the status information SIF may represent the ready status of the semiconductor memory device 100. The read operation controller 153 may generate the read control signal $CTR_{RD}$ for controlling the read operation of the peripheral circuit 120, in response to the status information SIF of the ready status and the command information $CMD_{INF}$ corresponding to the read command. Accordingly, the peripheral circuit 120 may start the read operation, and the status information SIF may represent the busy status of the semiconductor memory device 100 during the read operation.

When the peripheral circuit 120 completes the read operation, the status information SIF may be changed from the busy status to the ready status. The operation resume controller 154 may generate the resume control signal $CTR_{RSM}$ for resuming the program operation which has been suspended under the control of the operation suspend controller 152, based on the status information SIF of the ready status.

Meanwhile, although not shown in FIG. 10B, the control signal generator 133 may further include an erase operation controller. The erase operation controller may generate an erase control signal for controlling an erase operation of the peripheral circuit 120, in response to the status information SIF of the ready status and the command information $CMD_{INF}$ corresponding to an erase command.

Figure 11:
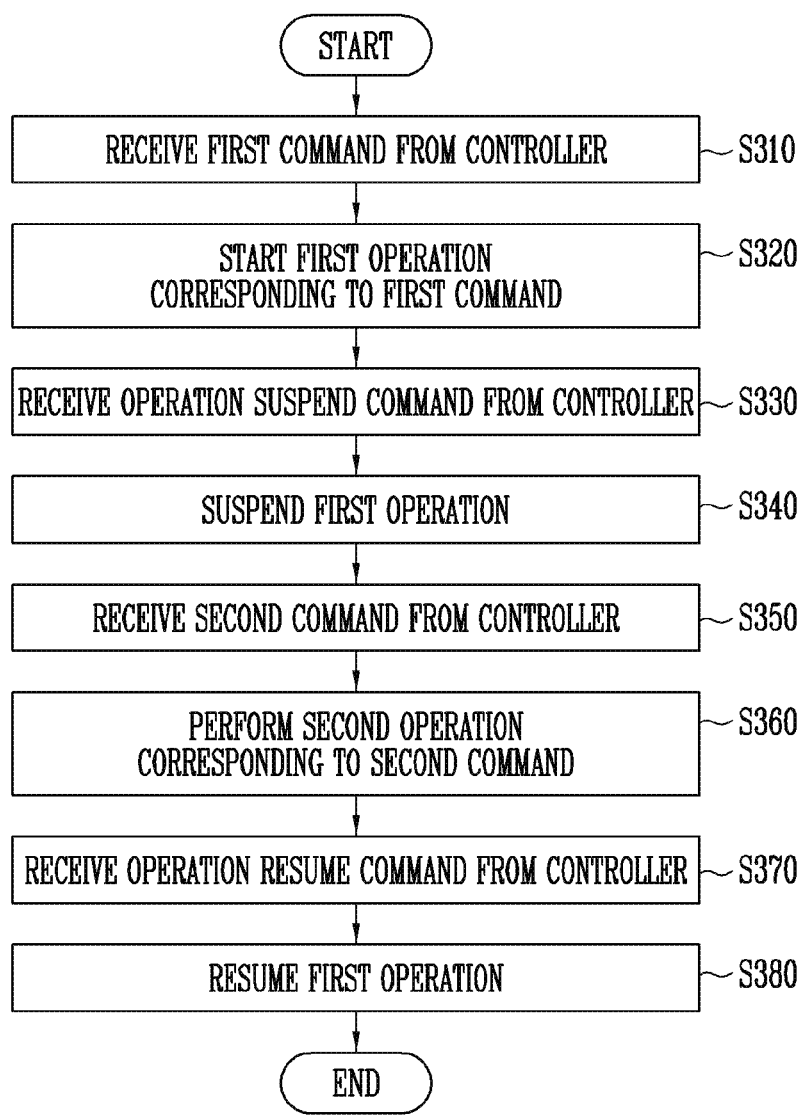
FIG. 11 is a flowchart illustrating an operation of the semiconductor memory device in a first mode.

FIG. 11 is a flowchart illustrating an operation of the semiconductor memory device in the first mode.

First, in step S310, the semiconductor memory device 100 may receive a first command from the controller 200. For example, the first command may be an erase command or a program command. In step S320, the semiconductor memory device 100 may start a first operation corresponding to the received first command. That is, in the step S320, the semiconductor memory device 100 may start an erase operation or a program operation.

Because the semiconductor memory device 100 operates in the first mode, as described with reference to FIGS. 7 to 9, the controller 200 may generate an operation suspend command and transfer the generated operation suspend command to the semiconductor memory device 100 so as to suspend the operation being currently performed by the semiconductor memory device 100 and preferentially perform a new operation (S230 and S240 shown in FIG. 9). Accordingly, in step S330, the semiconductor memory device 100 may receive the operation suspend command from the controller 200. The semiconductor memory device 100 suspends the first operation being performed, in response to the received operation suspend command (S340).

When the status of the semiconductor memory device 100 is changed to the ready status as the first operation is suspended, the controller 200 may generate an operation command for a second operation and transfer the generated operation command to the semiconductor memory device 100 as described in the step S250 shown in FIG. 9. Accordingly, in step S350, the semiconductor memory device 100 may receive a second command from the controller 200. The second command may be an operation command described in the step S250 shown in FIG. 9. In step S360, the semiconductor memory device performs the second operation corresponding to the second command. In an example, the second command may be a read command, and the second operation may be a read operation.

When the second operation is completed, the controller 200 may generate an operation resume command for resuming the first operation and transfer the generated operation resume command to the semiconductor memory device 100 as described in the step S260 shown in FIG. 9. Accordingly, in step S370, the semiconductor memory device 100 may receive the operation resume command from the controller 200. Subsequently, in step S380, the semiconductor memory device 100 may resume the operation which has been suspended.

Figure 12:
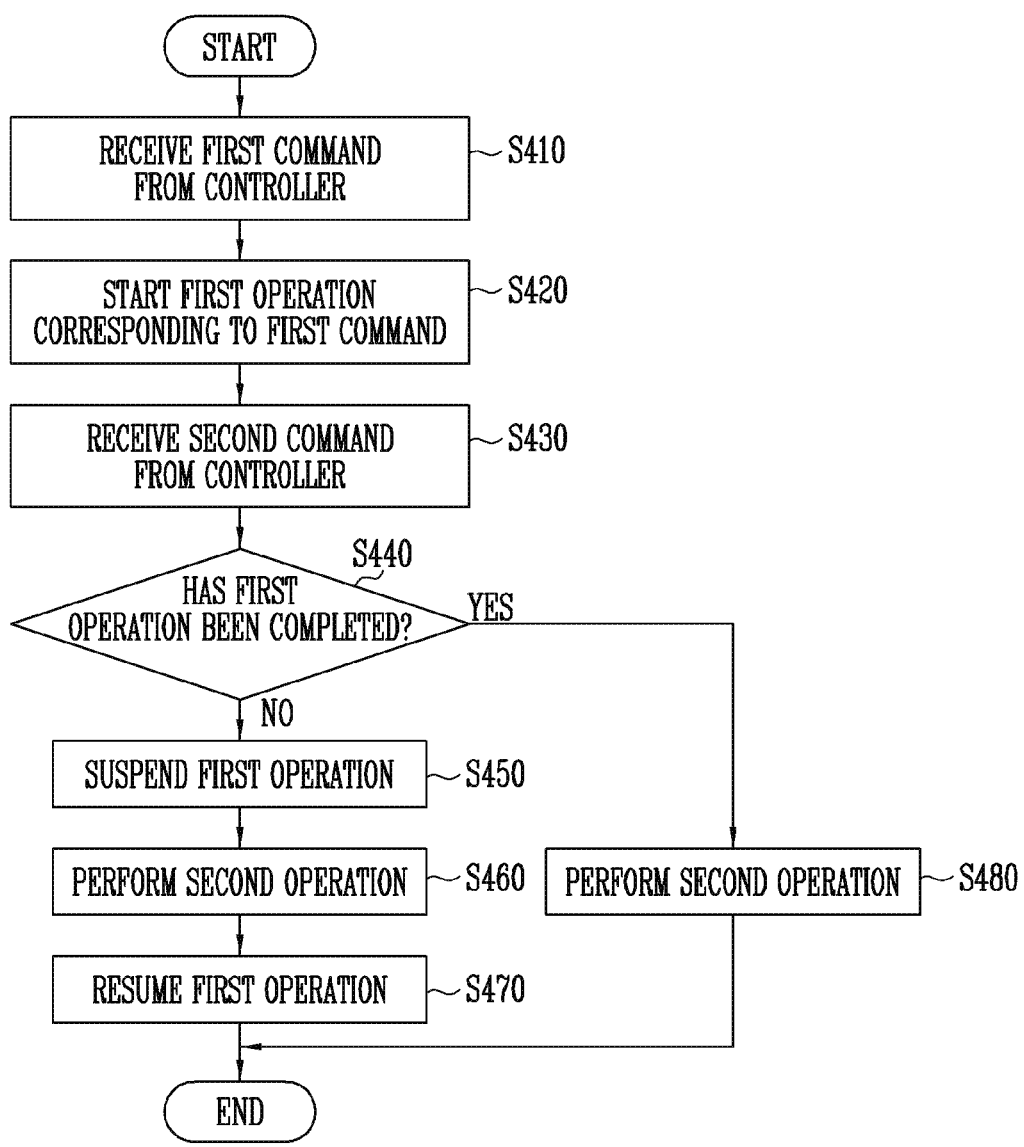
FIG. 12 is a flowchart illustrating an operation of the semiconductor memory device in a second mode.

FIG. 12 is a flowchart illustrating an operation of the semiconductor memory device 100 in the second mode.

First, in step S410, the semiconductor memory device 100 may receive a first command from the controller 200. For example, the first command may be an erase command or a program command. In step S420, the semiconductor memory device 100 may start a first operation corresponding to the received first command. That is, in the step S420, the semiconductor memory device 100 may start an erase operation or a program operation.

Because the semiconductor memory device 100 operates in the second mode, as described with reference to FIGS. 7 to 9, the controller 200 may generate an operation command corresponding to an operation request received from the host and transfer the generated operation command to the semiconductor memory device 100 so as to suspend the operation being currently performed by the semiconductor memory device 100 and preferentially perform a new operation (S270 shown in FIG. 9). Accordingly, in step S430, the semiconductor memory device 100 may receive a second command from the controller 200. The second command may be an operation command described in the step S270 shown in FIG. 9.

In step S440, the semiconductor memory device 100 determines whether the first operation has been completed. As a determination result of the step S440, when the first operation is not completed (S440) (No), the semiconductor memory device 100 suspends the performance of the first operation (S450). Subsequently, the semiconductor memory device 100 performs a second operation corresponding to the second command received in the step S430 (S460). In an example, the second command may be a read command, and the second operation may be a read operation.

When the second operation is completed, the semiconductor memory device 100 resumes the performance of the first operation which has been suspended (S470).

As a determination result of the step S440, when the first operation is completed (S440) (Yes), the semiconductor memory device 100 is in the ready status, and hence the semiconductor memory device 100 performs the second operation corresponding to the second command (S480).

According to the semiconductor memory device 100 in accordance with the embodiment of the present disclosure, when the semiconductor memory device 100 receives a command for performing the second operation from the controller in a situation in which the semiconductor memory device 100 is in the busy status because the semiconductor memory device 100 is performing the first operation, the semiconductor memory device 100 suspends the first operation being currently performed and performs the second operation. Subsequently, when the performance of the second operation Is completed, the semiconductor memory device 100 resumes the first operation. That is, the suspend of the first operation of the semiconductor memory device 100, the performance of the second operation of the semiconductor memory device 100, and the resume of the first operation of the semiconductor memory device 100 may be performed without using the operation suspend command and the operation resume command. Accordingly, the operation speed of the semiconductor memory device and the memory system having the same can be improved.

Figure 13:
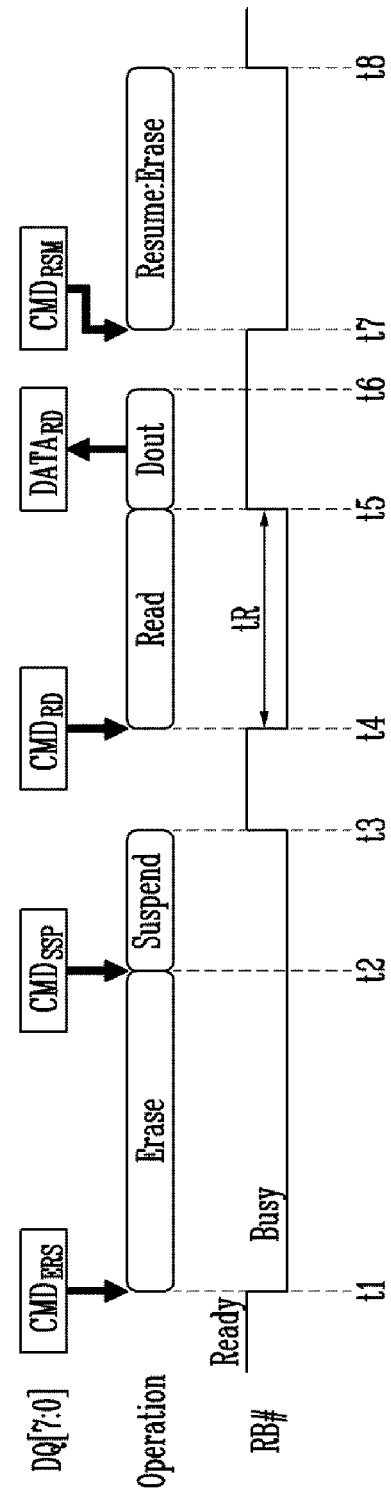
FIG. 13 is a timing diagram illustrating the operation of the semiconductor memory device in the first mode.

FIG. 13 is a timing diagram illustrating the operation of the semiconductor memory device 100 in the first mode.

Referring to FIG. 13, commands and data, which are input/output through the data input/output lines DQ[7:0], operations of the semiconductor memory device 100, and statuses of the ready-busy signal RB # are sequentially illustrated. The semiconductor memory device 100 has the ready status at the beginning. At a time t1, an erase command $CMD_{ERS}$ is input to the semiconductor memory device 100 from the controller 200 through the data input/output lines DQ[7:0]. Accordingly, the semiconductor memory device 100 starts an erase operation from the time t1, and the status of the ready-busy signal RB # is changed to the busy status.

Subsequently, a case where a read request is received from the host to the controller 200 at a time t2 is assumed.

The operation mode of the semiconductor memory device 100 is set as the first mode, and the semiconductor memory device 100 is in the busy status at the time t2. Therefore, the controller generates an operation suspend command $CMD_{SSP}$ and transfers the generated operation suspend command $CMD_{SSP}$ to the semiconductor memory device 100 according to the step S240 shown in FIG. 9. The semiconductor memory device 100 suspends the erase operation in response to the received operation suspend command $CMD_{SSP}$. When the erase operation is suspended, during a period t2 to t3, a voltage pump in the voltage generator 122 may be discharged, and word and bit lines coupled to the memory cell array 110 may be discharged. When the above-described operation is completed, at a time t3, the status of the semiconductor memory device 100 is changed to the ready status. Accordingly, the status of the ready-busy signal RB # is changed to the ready status at the time t3.

According to the step S250 shown in FIG. 9, at a time t4, the controller 200 generates a read command $CMD_{RD}$ and transfers the generated read command $CMD_{RD}$ to the semiconductor memory device 100 through the data input/output lines DQ[7:0]. The semiconductor memory device 100 performs a read operation in response to the received read command $CMD_{RD}$. The read operation may be performed during a read time tR. When the read operation is completed, at a time t5, the status of the semiconductor memory device 100 is changed to the ready status. Accordingly, the status of the ready-busy signal RB # is changed to the ready status at the time t5. Read data may be stored in the cache buffer 124 shown in FIG. 2. An output operation Dout of the data stored in the cache buffer 124 is started at the time t5. Accordingly, during a period t5 to t6, read data DATARD is output to the controller 200 through the data input/output lines DQ[7:0].

According to the step S260 shown in FIG. 9, at a time t7, the controller 200 generates an operation resume command $CMD_{RSM}$ and transfers the generated operation resume command $CMD_{RSM}$ to the semiconductor memory device 100 through the data input/output lines DQ[7:0]. The semiconductor memory device 100 resumes the erase operation which has been suspended, in response to the received operation resume command $CMD_{RSM}$. At a time t8, when the erase operation is completed, the status of the semiconductor memory device 100 is changed to the ready status. Accordingly, the status of the ready-busy signal RB # is changed to the ready status at the time t8.

Figure 14:
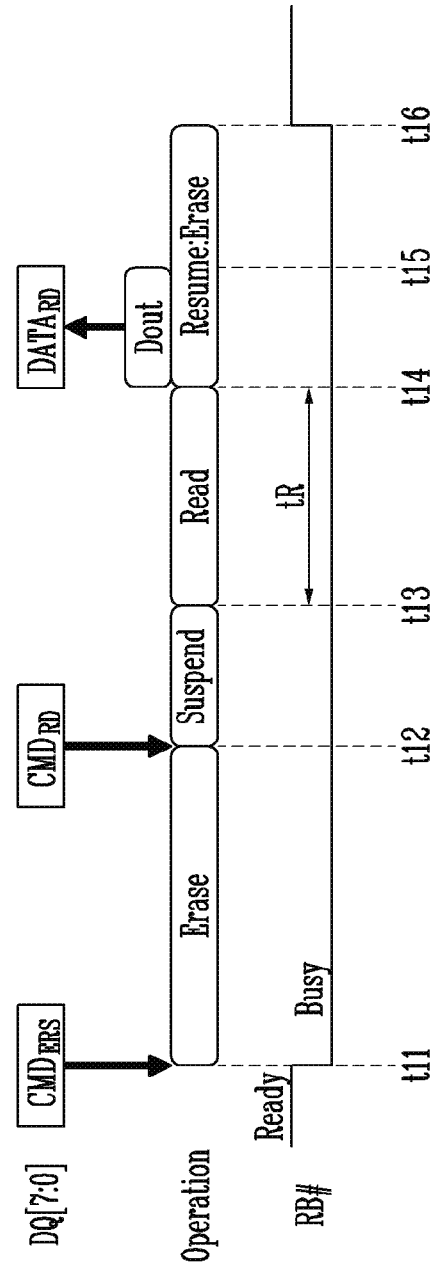
FIG. 14 is a timing diagram illustrating the operation of the semiconductor memory device in the second mode.

FIG. 14 is a timing diagram illustrating the operation of the semiconductor memory device 100 in the second mode.

Referring to FIG. 14, like FIG. 13, commands and data, which are input/output through the data input/output lines DQ[7:0], operations of the semiconductor memory device 100, and statuses of the ready-busy signal RB # are sequentially illustrated. The semiconductor memory device 100 has the ready status at the beginning. At a time t11, an erase command $CMD_{ERS}$ is input to the semiconductor memory device 100 from the controller 200 through the data input/output lines DQ[7:0]. Accordingly, the semiconductor memory device 100 starts an erase operation from the time t11, and the status of the ready-busy signal RB # is changed to the busy status.

Subsequently, a case where a read request is received from the host to the controller 200 at a time t12 is assumed. The operation mode of the semiconductor memory device 100 is set as the second mode, and the semiconductor memory device 100 is in the busy status at the time t12. Therefore, the controller 200 generates a read command $CMD_{RD}$ corresponding to the read request and transfers the generated read command $CMD_{RD}$ to the semiconductor memory device 100 through the data input/output lines DQ[7:0] according to the step S270 shown in FIG. 9. According to the step S450 shown in FIG. 12, the semiconductor memory device 100 suspends the erase operation in response to the received read command $CMD_{RD}$. When the erase operation is suspended, during a period t12 to t13, a voltage pump in the voltage generator 122 may be discharged, and word and bit lines coupled to the memory cell array 110 may be discharged. When the above-described operation is completed, at a time t13, the semiconductor memory device 100 performs a read operation corresponding to the received read command $CMD_{RD}$. The read operation may be performed during a read time tR. When the read operation is completed, read data may be stored in the cache buffer 124 shown in FIG. 2. At a time t4, an output operation Dout of the data stored in the cache buffer 124 is started. Accordingly, during a period t14 to t15, data $DATA_{RD}$ read through the data input/output lines DQ[7:0] is output to the controller 200.

Meanwhile, at a time t14, the semiconductor memory device 100 may resume the erase operation which has been suspended. Because the erase operation does not require the cache buffer 124, the resumed erase operation and the output operation Dout of the data from the cache buffer 124 may be performed while overlapping with each other. At a time t16, when the erase operation is completed, the status of the semiconductor memory device 100 is changed to the ready status. Accordingly, the status of the ready-busy signal RB # is changed to the ready status at the time t16.

Referring to FIGS. 13 and 14 together, because the operation suspend command and the operation resume command are used when the semiconductor memory device operates in the first mode, there exist periods t3 to t4 and t5 to t6 in which the semiconductor memory device has the ready status during the entire operation. On the other hand, when the semiconductor memory device operates in the second mode, the suspend of the erase operation, the performance of the read operation, and the resume of the erase operation are sequentially performed using only the read command, without the operation suspend command and the operation resume command. Therefore, there exists no period in which the semiconductor memory device has the ready status during the entire operation.

Thus, when the semiconductor memory device operates in the second mode, the operation speed of the semiconductor memory device and the memory system having the same can be increased, as compared with when the semiconductor memory device operates in the first mode. On the other hand, when the semiconductor memory device operates in the first mode, the semiconductor memory device and the memory system having the same can stably operate, as compared with when the semiconductor memory device operates in the second mode.

Figure 15:
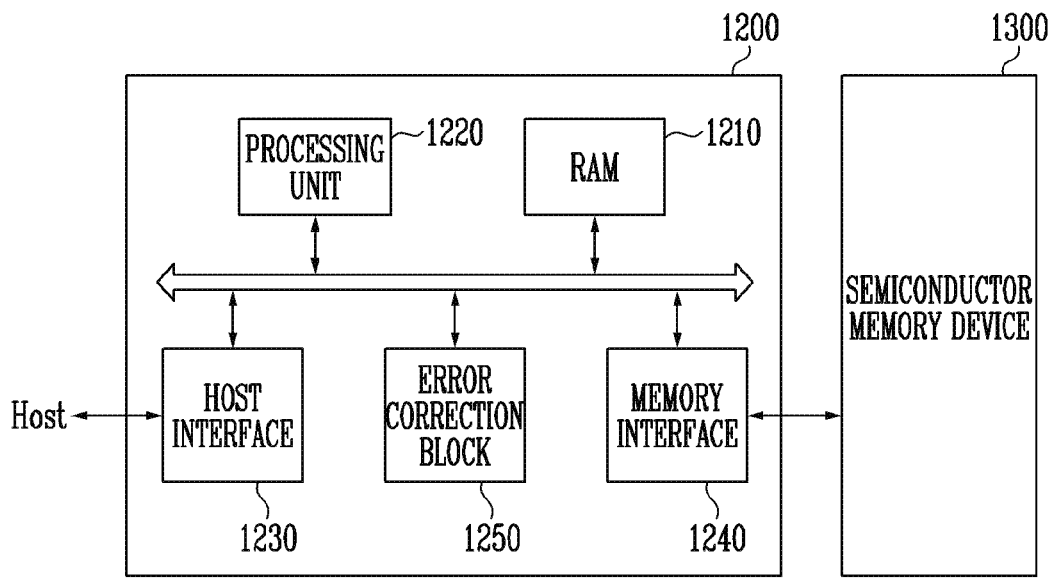
FIG. 15 is a block diagram illustrating the memory system including the semiconductor memory device shown in FIG. 2.

FIG. 15 is a block diagram illustrating a memory system 1000 including the semiconductor memory device shown in FIG. 2.

Referring to FIG. 15, the memory system 1000 includes a semiconductor memory device 1300 and a controller 1200.

The semiconductor memory device 1300 may be configured and operated identically to the semiconductor memory device 100 described with reference to FIG. 2. Hereinafter, repeated descriptions will be omitted.

The controller 1200 is coupled to a host Host and the semiconductor memory device 1300. The controller 1200 accesses the semiconductor memory device 1300 in response to a request from the host Host. For example, the controller 1200 controls read, program, erase, and background operations of the semiconductor memory device 1300. The controller 1200 provides an interface between the semiconductor memory device 1300 and the host Host. The controller 1200 drives firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as any one of a working memory of the processing unit 1220, a cache memory between the semiconductor memory device 1300 and the host Host, and a buffer memory between the semiconductor memory device 1300 and the host Host.

The processing unit 1220 controls overall operations of the controller 1200. The processing unit 1220 controls a read operation, a program operation, an erase operation, and a background operation of the semiconductor memory device 1300. The processing unit 1220 drives firmware for controlling the semiconductor memory device 1300. The processing unit 1220 may perform a function of a flash translation layer (FTL). The processing unit 1220 may translate a logical block address (LBA) provided by the host Host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processing unit 1220 randomizes data received from the host Host. For example, the processing unit 1220 may randomize data received from the host Host by using a randomizing seed. The randomized data is provided as data to be stored to the semiconductor memory device 1300 to be programmed in a memory cell array.

The processing unit 1220 derandomizes data received from the semiconductor memory device 1300 in a read operation. For example, the processing unit 1220 may derandomize data received from the semiconductor memory device 1300 by using a derandomizing seed. The derandomized data may be output to the host Host.

In an embodiment, the processing unit 1220 may perform randomizing and derandomizing by driving software or firmware.

The host interface 1230 includes a protocol for exchanging data between the host Host and the controller 1200. In an embodiment, the controller 1200 communicates with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1240 interfaces with the semiconductor memory device 1300. For example, the memory interface 1240 may include a NAND interface or a NOR interface.

The error correction block 1250 detects and corrects an error of data received from the semiconductor memory device 1300 by using an error correction code (ECC). The error correction block 1250 may correct an error of read page data, using an ECC. The error correction block 1250 may correct an error, using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation (BCM), Hamming code, etc.

In a read operation, the error correction block 1250 may correct an error of read page data. When error bits of which number exceeds an error correctable bit number are included in the read page data, decoding may fail. When error bits of which number is equal to or smaller than the error correctable bit number are included in the read page data, the decoding may succeed. The success of the decoding represents that a corresponding read command has passed. The failure of the decoding represents that the corresponding command has failed. When the decoding succeeds, the controller 1200 outputs the page data of which error has been corrected to the host Host.

The controller 1200 and the semiconductor memory device 1300 may be integrated into one semiconductor device. In an embodiment, the controller 1200 and the semiconductor memory device 1300 may be integrated into one semiconductor device, to constitute a memory card. For example, the controller 1200 and the semiconductor memory device 1300 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1200 and the semiconductor memory device 1300 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various to electronic devices that constitute a telematics network, an RFID device, or one of various components that constitute a computing system.

In an embodiment, the semiconductor memory device 1300 or the memory system 1000 may be packaged in various forms. For example, the semiconductor memory device 1300 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 16:
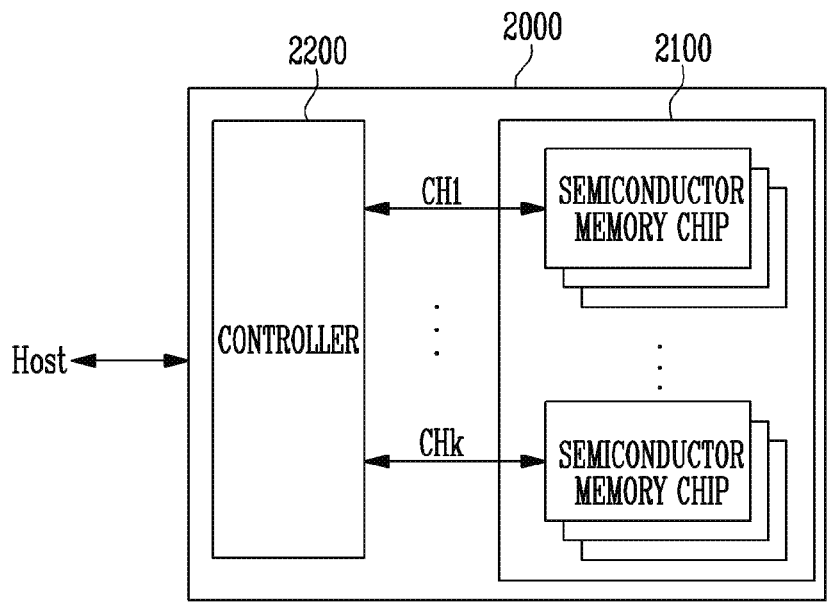
FIG. 16 is a block diagram illustrating an application example of the memory system shown in FIG. 15.

FIG. 16 is a block diagram illustrating an application example 2000 of the memory system shown in FIG. 15.

Referring to FIG. 16, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 16, there is illustrated a case where the plurality of groups communicate with the controller 2200 through first to kth channels CH1 to CHk. Each semiconductor memory chip may be configured and operated identically to the semiconductor memory device 1300 described with reference to FIG. 15.

Each group is configured to communicate with the controller 2200 through one common channel. The controller 2200 is configured identically to the controller 1200 described with reference to FIG. 15. The controller 2200 controls the plurality of memory chips of the semiconductor memory device 2100 through the plurality of channels CH1 to CHk.

In FIG. 16, a case is described for which a plurality of semiconductor memory chips are coupled to one channel. However, it will be understood that the memory system 2000 may be modified such that one semiconductor memory chip is coupled to one channel.

Figure 17:
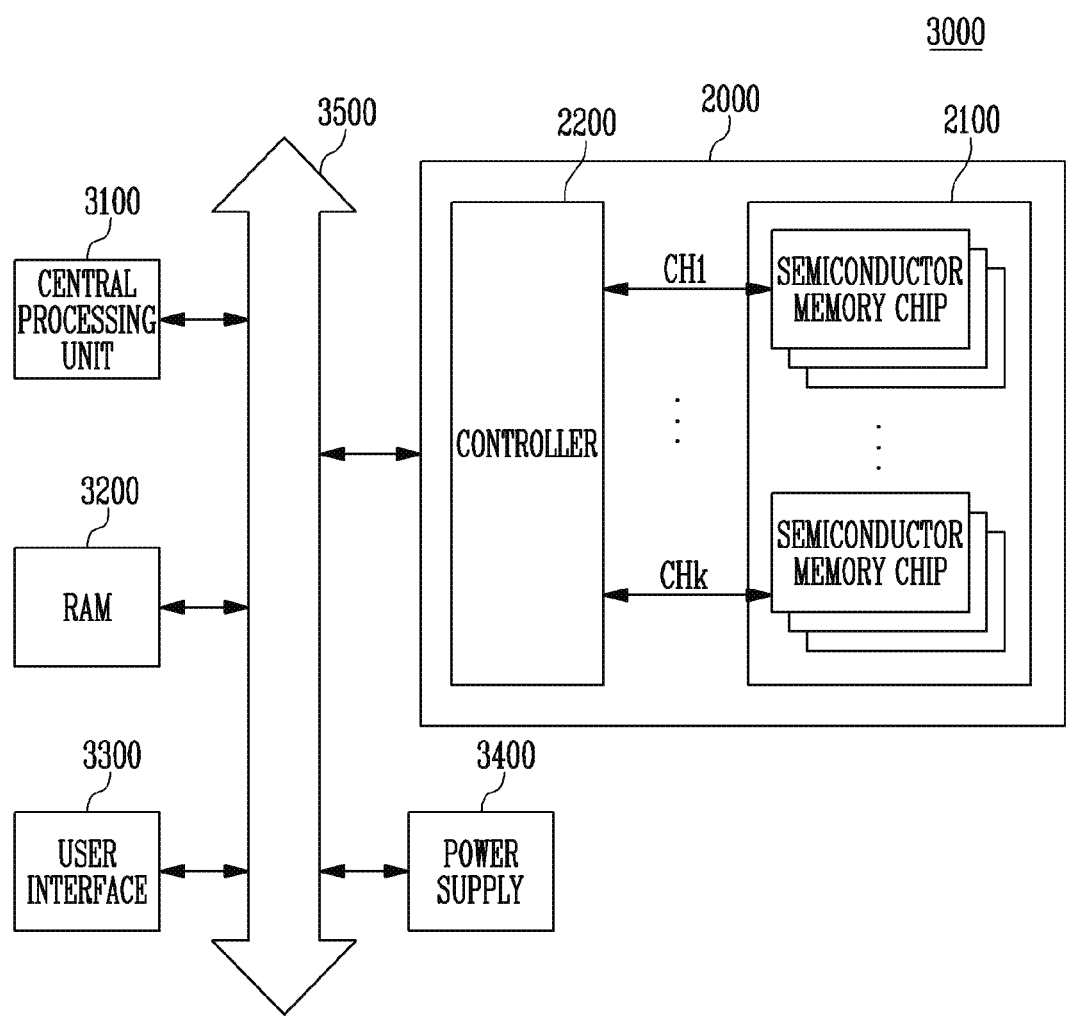
FIG. 17 is a block diagram illustrating a computing system including the memory system described with reference to FIG. 16.

FIG. 17 is a block diagram illustrating a computing system 3000 including the memory system 2000 described with reference to FIG. 16.

Referring to FIG. 17, the computing system 3000 includes a central processing unit 3100, a RAM 3200, a user interface 3300, a power supply 3400, a system bus 3500, and the memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 17, there is illustrated a case where the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

In FIG. 17, there is illustrated a case where the memory system 2000 described with reference to FIG. 16 is provided. However, the memory system 2000 may be replaced by the memory system 1000 described with reference to FIG. 15. In an embodiment, the computing system 3000 may include both of the memory systems 1000 and 2000 described with reference to FIGS. 15 and 16.

In accordance with embodiments of the present disclosure, a semiconductor memory device, a controller, and operating methods thereof may provide improved operational speeds.

While the present disclosure has been illustrated and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed and some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device performing memory operations controlled by a controller, the semiconductor memory device comprising:
   a memory cell array including a plurality of memory cells;
   a peripheral circuit configured to perform a first operation, corresponding to a first command received from the controller, on selected memory cells among the plurality of memory cells; and
   a control logic circuit configured to, when a second command is received while the first operation is being performed, control the peripheral circuit to suspend the first operation, to perform a second operation, and to resume a suspended first operation while outputting data obtained by the second operation to the controller without receiving additional commands.

2. The semiconductor memory device of claim 1, wherein the control logic circuit includes:
   a command receiver configured to receive the first and second commands;
   an operation status determiner configured to generate status information representing an operation status of the semiconductor memory device;
   a ready-busy signal generator configured to generate a ready-busy signal, based on the status information; and
   a control signal generator configured to generate a control signal for controlling the peripheral circuit, based on the status information and the first and second commands.

3. The semiconductor memory device of claim 2, wherein the control logic circuit is configured to control the peripheral circuit to resume the performance of the first operation, when the second operation is completed.

4. The semiconductor memory device of claim 3, wherein the control signal generator includes:
   a first operation controller configured to generate a control signal for performing the first operation;
   an operation suspend controller configured to generate a control signal for suspending the performance of the first operation;
   a second operation controller configured to generate a control signal for performing the second operation; and an operation resume controller configured to generate a control signal for resuming the performance of the first operation.

5. The semiconductor memory device of claim 4, wherein, when the status information represents a busy status, and the second command is a read command,
the operation suspend controller is configured to generate a first control signal for controlling the peripheral circuit to suspend the performance of the first operation, and
the second operation controller is configured to generate a second control signal for controlling the peripheral circuit to perform a read operation.

6. The semiconductor memory device of claim 5, wherein, when the status information represents that the second operation has completed,
the operation resume controller is configured to generate a third control signal for controlling the peripheral circuit to resume the performance of the first operation.

7. The semiconductor memory device of claim 6, wherein the ready-busy signal represents a busy status, when the performance of the first operation is suspended, when the second operation is performed, and when the first operation is resumed.

8. The semiconductor memory device of claim 7, wherein the first operation includes an erase operation.

9. The semiconductor memory device of claim 1, wherein, in response to a third command received in a ready status after the first operation is completed,
the control logic circuit is configured to control the peripheral circuit to perform a third operation corresponding to the third command.

10. The semiconductor memory device of claim 1, wherein, in response to an operation suspend command received while the first operation is being performed,
the control logic circuit is configured to control the peripheral circuit to suspend the performance of the first operation.

11. The semiconductor memory device of claim 10, wherein, in response to a third command received in a state in which the performance of the first operation is suspended,
the control logic circuit is configured to control the peripheral circuit to perform a third operation corresponding to the third command.

12. The semiconductor memory device of claim 11, wherein, in response to an operation resume command received in a state in which the performance of the third operation is completed,
the control logic circuit is configured to control the peripheral circuit to resume the first operation.

13. A controller for controlling a semiconductor memory device to perform an operation in a first mode or a second mode according to an operation request from a host, the controller comprising:
a host request receiver configured to receive the operation request and generate request information corresponding to the operation request;
an operation mode determiner configured to determine one of the first mode and the second mode as an operation mode and store operation mode information of the semiconductor memory device which corresponds to the determined operation mode;
a ready-busy signal receiver configured to receive a ready-busy signal corresponding to ready-busy information identifying whether the semiconductor memory device is in a ready status or a busy status from the semiconductor memory device; and
a command generator configured to generate a first command requesting the semiconductor memory device to suspend a first operation in progress when the operation mode is the first mode and the semiconductor memory device is in the busy status, to provide the first command to the semiconductor memory device, to generate a second command requesting the semiconductor memory device to perform a second operation corresponding to the second command when the semiconductor memory device is in the ready status, and to provide the second command to the semiconductor memory device after the first operation has been suspended, and when the operation mode is the second mode, to generate a third command requesting the semiconductor memory device to suspend the first operation, to perform the second operation, and to resume a suspended first operation while the semiconductor memory device outputs data obtained by the second operation without receiving additional commands from the controller and to provide the third command to the semiconductor memory device.

14. The controller of claim 13, wherein, when the operation mode information represents the first mode,
the command generator is configured to generate the first command in response to the ready-busy signal of the busy status, and transfer the generated first command to the semiconductor memory device.

15. The controller of claim 14, wherein the command generator is configured to transfer an operation command to the semiconductor memory device in response to the ready-busy signal of the ready status, after the command generator transfers an operation suspend command to the semiconductor memory device.

16. The controller of claim 15, wherein the command generator is configured to transfer an operation resume command to the semiconductor memory device in response to the ready-busy signal of the ready status, after the command generator transfers the operation command to the semiconductor memory device.

17. The controller of claim 13, wherein, when the operation mode represents the second mode,
the command generator is configured to generate the second command and transfer the generated second command to the semiconductor memory device, in response to the read-busy signal of the busy status.

* * * * *